(12) United States Patent
Liang et al.

(10) Patent No.: US 12,080,812 B2
(45) Date of Patent: Sep. 3, 2024

(54) PHOTOELECTRIC DETECTION SUBSTRATE AND MANUFACTURING METHOD THEREOF, AND PHOTOELECTRIC DETECTION DEVICE

(71) Applicants: Beijing BOE Technology Development Co., Ltd., Beijing (CN); BOE Technology Group Co., Ltd., Beijing (CN)

(72) Inventors: Kui Liang, Beijing (CN); Tuo Sun, Beijing (CN); Yichi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 18 days.

(21) Appl. No.: 17/432,422

(22) PCT Filed: Feb. 22, 2021

(86) PCT No.: PCT/CN2021/077213
§ 371 (c)(1),
(2) Date: Aug. 19, 2021

(87) PCT Pub. No.: WO2021/185025
PCT Pub. Date: Sep. 23, 2021

(65) Prior Publication Data
US 2023/0138242 A1    May 4, 2023

(30) Foreign Application Priority Data
Mar. 20, 2020  (CN) .......................... 202010199954.5

(51) Int. Cl.
  H01L 31/0224    (2006.01)
  H01L 31/042     (2014.01)
  H01L 31/18      (2006.01)
(52) U.S. Cl.
  CPC ........ H01L 31/0224 (2013.01); H01L 31/042 (2013.01); H01L 31/18 (2013.01)
(58) Field of Classification Search
  CPC ... H01L 31/0224; H01L 31/042; H01L 31/18; H01L 31/115; H01L 27/146;
  (Continued)

(56) References Cited

U.S. PATENT DOCUMENTS

2020/0020736 A1*  1/2020  Liang ................ H01L 27/14614
2021/0234059 A1   7/2021  Bu et al.

FOREIGN PATENT DOCUMENTS

| CN | 101969080 A | 2/2011 |
| CN | 108962928 A | 12/2018 |
| CN | 109801935 A | 5/2019 |

OTHER PUBLICATIONS

PCT/CN2021/077213 international search report and written opinion.

* cited by examiner

Primary Examiner — Mohammad A Rahman
(74) Attorney, Agent, or Firm — IPro, PLLC

(57) ABSTRACT

A photoelectric detection substrate and a manufacturing method thereof, and a photoelectric detection device are provided. The photoelectric detection substrate includes: a base substrate and a semiconductor layer arranged on the base substrate, wherein the semiconductor layer is configured to convert an optical signal into an electrical signal.

15 Claims, 4 Drawing Sheets

(58) Field of Classification Search
CPC ....... H01L 31/022408; H01L 27/14643; H01L 27/14663; H01L 27/14683; Y02P 70/50
See application file for complete search history.

PHOTOELECTRIC DETECTION SUBSTRATE AND MANUFACTURING METHOD THEREOF, AND PHOTOELECTRIC DETECTION DEVICE

CROSS-REFERENCE TO RELATED APPLICATIONS

The present disclosure is the U.S. national phase of PCT Application No. PCT/CN2021/077213 filed on Feb. 22, 2021, which claims priority to Chinese Patent Application No. 202010199954.5 filed in China on Mar. 20, 2020, which are incorporated herein by reference in their entireties.

TECHNICAL FIELD

The present disclosure relates to the technical field of photoelectric detection, in particular to a photoelectric detection substrate and a manufacturing method thereof, and a photoelectric detection device.

BACKGROUND

Detection technologies, such as X-ray detection technology, are widely used in fields of medical treatment, security, non-destructive testing, scientific research, etc. The X-ray detection technology may convert X-ray signals to be detected into images or photos that may be displayed directly on a screen.

Currently, detection devices using the X-ray detection technology usually use PIN diodes as photosensitive elements to realize photoelectric conversion. However, when the above PIN diode is being manufactured, it is necessary to implement ion doping such as p-type ion doping, making the manufacturing process complicated.

Unlike conventional PIN diode detectors, the photodetector with a metal-semiconductor-metal interdigital electrode structure does not require the p-type doping, and thus the manufacturing process is relatively simple, which has advantages of low cost, compatibility with the manufacturing process of thin film transistors and field effect transistors, easy integration, fast response speed, low dark current, high filling rate, etc., and plays an important role in fields of medical imaging and industrial detection.

In the related art, the number of patterning processes for manufacturing a photoelectric detection substrate is large, which adversely affects the production cost and productivity of the photoelectric detection substrate.

SUMMARY

Embodiments of the present disclosure provide a photoelectric detection substrate and a manufacturing method thereof, and a photoelectric detection device.

In one aspect, the embodiments of the present disclosure provide a photoelectric detection substrate including:

a base substrate; and a semiconductor layer arranged on the base substrate, wherein the semiconductor layer is configured to convert an optical signal into an electrical signal.

Optionally, the photoelectric detection substrate further includes:

an interdigital electrode arranged at a side of the semiconductor layer distal to the base substrate;

a flat layer arranged at a side of the interdigital electrode distal to the base substrate; and a switching transistor arranged at a side of the flat layer distal to the base substrate, wherein the switching transistor is connected to the interdigital electrode through a via hole penetrating through the flat layer Optionally, the interdigital electrode includes comb-shaped sensing sub-electrodes and comb-shaped biasing sub-electrodes, and the sensing sub-electrodes and the biasing sub-electrodes are arranged alternately.

Optionally, a side surface of the semiconductor layer distal to the base substrate is provided with a plurality of grooves in which the sensing sub-electrodes and the biasing sub-electrodes are arranged.

Optionally, a light shielding metal layer is arranged on the side surface of the semiconductor layer distal to the base substrate, and an orthographic projection of the light shielding metal layer on the base substrate does not overlap with an orthographic projection of the groove on the base substrate.

Optionally, the light shielding metal layer and the interdigital electrode are made of a same material.

Optionally, the photoelectric detection substrate further includes a plurality of reading signal lines and a plurality of gating signal lines, wherein the reading signal lines and the gating signal lines are intersected to define a plurality of detection units;

a respective one interdigital electrode and a respective one switching transistor are arranged in each of the detection units; and a gate electrode of the switching transistor is electrically connected to the gating signal line, a first electrode of the switching transistor is electrically connected to the sensing sub-electrode, and a second electrode of the switching transistor is electrically connected to the reading signal line.

Optionally, an orthographic projection of an active layer of the switching transistor on the base substrate is within the orthographic projection of the light shielding metal layer on the base substrate.

Optionally, the photoelectric detection substrate further includes:

a first insulating layer arranged between the interdigital electrode and the semiconductor layer Optionally, the photoelectric detection substrate further includes:

a second insulating layer arranged between the base substrate and the semiconductor layer.

Optionally, the interdigital electrode is in direct physical contact with the semiconductor layer.

Optionally, the interdigital electrode has a thickness of 200 nm to 260 nm.

Optionally, the semiconductor layer has a thickness of 250 nm to 300 nm.

Optionally, the base substrate is an optical waveguide glass substrate or a flexible substrate.

Optionally, the photoelectric detection substrate further includes a wavelength conversion layer configured to convert non-visible light into visible light;

wherein the wavelength conversion layer is arranged at a side of the semiconductor layer distal to the interdigital electrode.

In another aspect, the embodiments of the present disclosure further provide a photoelectric detection device including the above photoelectric detection substrate.

In yet another aspect, the embodiments of the present disclosure further provide a method for manufacturing a photoelectric detection substrate, including:

providing a base substrate; and forming a semiconductor layer on the base substrate, wherein the semiconductor layer is configured to convert an optical signal into an electrical signal.

Optionally, the method further includes:

forming an interdigital electrode at a side of the semiconductor layer distal to the base substrate;

forming a flat layer covering the interdigital electrode; and forming a switching transistor at a side of the flat layer distal to the base substrate, wherein the switching transistor is connected to the interdigital electrode through a via hole penetrating through the flat layer.

Optionally, the interdigital electrode includes comb-shaped sensing sub-electrodes and comb-shaped biasing sub-electrodes, the sensing sub-electrodes and the biasing sub-electrodes are arranged alternately, forming the semiconductor layer on the base substrate includes: forming a plurality of grooves on a side surface of the semiconductor layer distal to the base substrate, forming the interdigital electrode at the side of the semiconductor layer distal to the base substrate includes: forming the sensing sub-electrodes and the biasing sub-electrodes in the grooves.

Optionally, the method further includes:

forming a light shielding metal layer, wherein the light shielding metal layer is arranged at a side of an active layer of the switching transistor proximate to the base substrate, an orthographic projection of the light shielding metal layer on the base substrate does not overlap with an orthographic projection of the groove on the base substrate; and an orthographic projection of the active layer on the base substrate is within the orthographic projection of the light shielding metal layer on the base substrate.

Optionally, the light shielding metal layer and the interdigital electrode are formed by a single patterning process.

Optionally, the method further includes:

forming a first insulating layer located between the interdigital electrode and the semiconductor layer.

Optionally, the method further includes:

forming a third insulating layer located between the flat layer and the switching transistor.

Optionally, the method further includes: before the semiconductor layer is formed, forming a wavelength conversion layer at a side of the semiconductor layer distal to the interdigital electrode, wherein the wavelength conversion layer is configured to convert non-visible light into visible light.

DETAILED DESCRIPTION

In order to make the technical problems to be solved, technical solutions and advantages of the present disclosure clear, a detailed description will be given below with reference to the accompanying drawings and specific embodiments.

Figure 1:
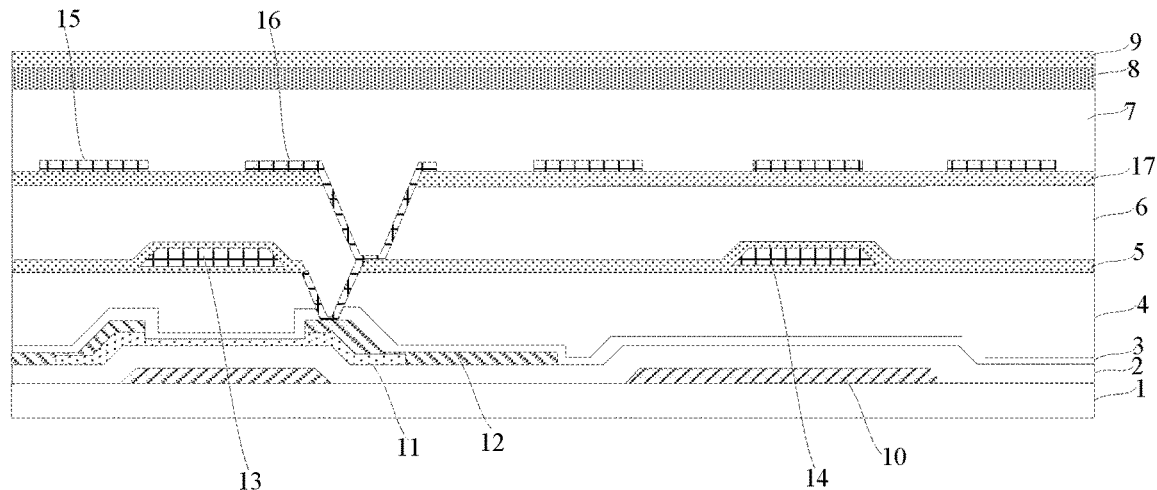
FIG. 1 is a schematic structural diagram of a photoelectric detection substrate in the related art.

A photoelectric detection substrate of the related art, as shown in FIG. 1, includes a base substrate 1, a gate insulating layer 2 located on the base substrate 1, a first passivation layer 3, a first flat layer 4, a first buffer layer 5, a second flat layer 6, a second buffer layer 17, a polyimide insulating layer 7, a semiconductor layer 8, a second passivation layer 9, a gate metal layer 10, an active layer 11, a source-drain metal layer 12, a light shielding metal layer 13, an storage capacitor electrode 14, biasing sub-electrodes 15, and sensing sub-electrodes 16, wherein the biasing sub-electrodes 15 and the sensing sub-electrodes 16 are arranged alternately to form an interdigital electrode.

As shown in FIG. 1, the polyimide (PI) insulating layer 7 is filled between the interdigital electrode and the semiconductor layer 8, and thus dark current may be significantly lowered, and the detection efficiency may be improved. Under illumination condition, the semiconductor layer 8 of the photoelectric detection substrate receives light, generates electric charges therein, and the resistance greatly decreases, so that an optical signal is converted into an electric signal through the photovoltaic effect. At this moment, the external biasing voltage is mostly applied to the PI insulating layer 7 with a very high resistance. When the voltage is sufficiently high, the PI insulating layer 7 may be turned on through the F-N tunneling effect of electrons, and the electric signal generated in the semiconductor layer 8 may be read and stored by turning on and off the thin film transistor, thereby achieving the purpose of detection.

In the photoelectric detection substrate shown in FIG. 1, metal (such as Mo and Al) is first deposited to form the interdigital electrode, and then the PI insulating layer 7 and the semiconductor layer 8 are manufactured. After the interdigital electrode is manufactured, a surface of the interdigital electrode is easily oxidized, and a metal oxide film is provided at a contact position between the interdigital electrode and the PI insulating layer 7, which increases the difficulty of carrier tunneling in the PI insulating layer 7, increases the resistance, and adversely affects the yield of the photoelectric detection substrate. In addition, in order to ensure the flatness of the PI insulating layer 7, the thickness of the interdigital electrode cannot be too large, which may be, for example, 50 nm to 70 nm. As shown in FIG. 1, the sensing sub-electrode 16 in the interdigital electrode is overlapped with and connected to the source-drain metal layer 12 through a via hole penetrating through the first flat layer 4, the first buffer layer 5, the second flat layer 6, and the second buffer layer 17 to realize signal transmission. However, the interdigital electrode has a small thickness, poor climbing performance, and poor deposition coverage. After the interdigital electrode is etched, corners are very steep, gradient angles are large, and thus the deposition coverage of a subsequent film layer will be adversely affected, poor contact is prone to occur at the corners, and breakage is prone to occur to interrupt the signal transmission. In addition, in order to ensure the flatness of a surface to be deposited of the interdigital electrode, it is necessary to form the first flat layer 4 covering the thin film transistor and the second flat layer 6 covering the light shielding metal layer 13, and thus the process steps are tedious. When a flat layer is being manufactured, it is necessary to apply an organic insulating material such as a resin for filling, and then perform high-temperature curing. During the high-temperature curing, thermal expansion and contraction will occur due to a temperature difference, and film peeling and foaming will occur due to a stress generated inside the photoelectric detection substrate, so that the structural stability of the photoelectric detection substrate is adversely affected. Because the surface of the interdigital electrode is covered with the PI insulating film 7, the semiconductor layer 8 and the passivation layer 9, it is further necessary to etch the PI insulating film 7, the semiconductor layer 8 and the passivation layer 9 to expose the interdigital electrode in a binding region, and the interdigital electrode is easily damaged during the etching. In order to avoid the damage of the interdigital electrodes, it is further necessary to deposit a layer of Indium Tin Oxide (ITO) and pattern the layer of the ITO to form a conductive protection pattern for protecting the interdigital electrodes, and thus the number of patterning processes for manufacturing the photoelectric detection substrate and the structural complexity of the photoelectric detection substrate are increased, and the productivity of the photoelectric detection substrate is reduced.

The embodiments of the present disclosure provide a photoelectric detection substrate and a manufacturing method thereof, and a photoelectric detection device, which may simplify the structure of the photoelectric detection substrate, reduce the production cost of the photoelectric detection substrate, and improve the structural stability of the photoelectric detection substrate.

The embodiments of the present disclosure provide a photoelectric detection substrate including:

a base substrate;

a semiconductor layer arranged on the base substrate;

an interdigital electrode arranged at a side of the semiconductor layer distal to the base substrate;

a flat layer arranged at a side of the interdigital electrode distal to the base substrate layer; and a switching transistor arranged at a side of the flat layer distal to the base substrate, wherein the switching transistor is connected to the interdigital electrode through a via hole penetrating through the flat layer. Optionally, the semiconductor layer is configured to convert an optical signal into an electrical signal.

In the present embodiment, the semiconductor layer is directly formed on the base substrate, and the base substrate itself may provide a flat surface, so that there is no need to form a flat layer before the semiconductor layer is manufactured, the process of manufacturing a flat layer before manufacturing of the semiconductor layer may be omitted, the number of flat layers in the photoelectric detection substrate may be reduced, and the manufacturing processes of a flat layer may be reduced, thereby simplifying the structure of the photoelectric detection substrate, reducing the production cost of the photoelectric detection substrate, and improving the productivity of the photoelectric detection substrate. In addition, when a flat layer is being manufactured, it is necessary to perform high-temperature curing, thermal expansion and contraction will occur due to a temperature difference, film peeling, foaming and the like will occur to the photoelectric detection substrate due to a stress generated inside the photoelectric detection substrate. Therefore, the structural stability of the photoelectric detection substrate is improved by reducing the number of flat layers.

In the related art, the interdigital electrode is first manufactured, and then the semiconductor layer is manufactured, so that upper and lower surfaces of the semiconductor layer are not completely flat. In the embodiments of the present disclosure, the semiconductor layer is directly formed on the base substrate, so that a surface of a side, proximate to the base substrate, of the semiconductor layer is substantially flat, wherein the substantially flat means that there is no patterned structure between the semiconductor layer and the base substrate, and the flatness of the surface of the side, proximate to the base substrate, of the semiconductor layer is greater than that of a surface of a side, distal to the base substrate, of the semiconductor layer.

Figure 2:
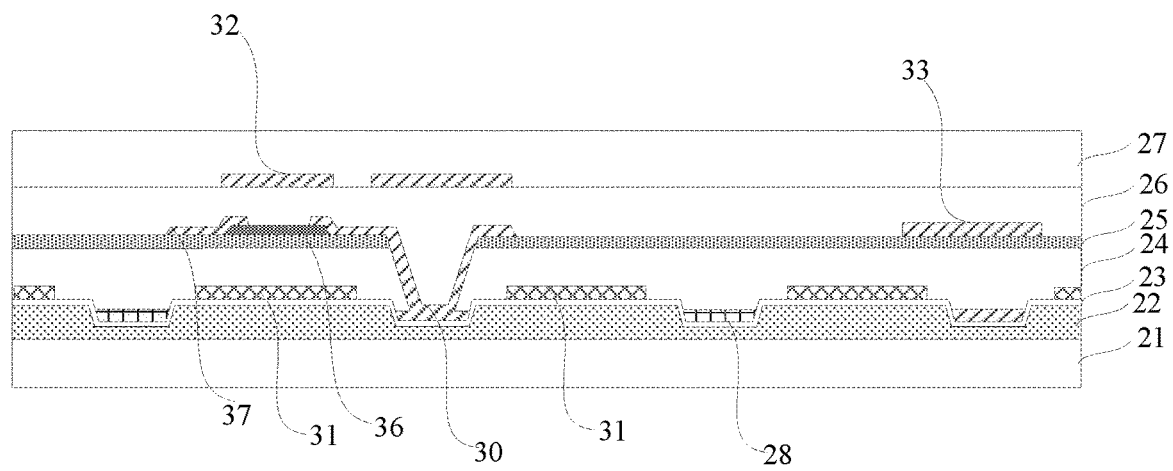
FIG. 2 to FIG. 7 are schematic structural diagrams of a photoelectric detection substrate according to embodiments of the present disclosure.

The base substrate may be a flexible substrate, and the flexible substrate may be made of PI, so that a flexible photoelectric detection substrate may be realized. As shown in FIG. 2, when the base substrate is a flexible substrate, the photoelectric detection substrate includes: a flexible substrate 21; a semiconductor layer 22 located on the flexible substrate 21; biasing sub-electrodes 28 and sensing sub-electrodes 30 located on the semiconductor layer 22, wherein the biasing sub-electrode 28 and the sensing sub-electrode 30 form an interdigital electrode; a flat layer 24 arranged at a side, distal to the flexible substrate 21, of the interdigital electrode; a switching transistor located at a side, distal to the flexible substrate 21, of the flat layer 24, wherein the switching transistor includes a gate electrode formed by a gate metal layer 32, an active layer 36, a source electrode and a drain electrode formed by a source-drain metal layer 37, a fourth insulating layer 26, and a passivation layer 27.

The semiconductor layer 22 may be made of a semiconductor amorphous silicon material such as amorphous Silicon (a-Si). The fourth insulating layer 26 may be made of at least one inorganic material such as silicon oxide, silicon nitride, and silicon oxynitride.

In the present embodiment, the semiconductor layer 22 is directly formed on the flexible substrate 21, and the flexible substrate 21 itself may provide a flat surface, so that there is no need to form a flat layer before the semiconductor layer 22 is manufactured, the process of manufacturing a flat layer before manufacturing of the semiconductor layer 22 may be omitted, and the number of flat layers in the photoelectric detection substrate may be reduced. As shown in FIG. 2, in the present embodiment, only one flat layer 24 needs to be manufactured, so that the present embodiment may reduce the manufacturing process of the flat layer, thereby simplifying the structure of the photoelectric detection substrate, reducing the production cost of the photoelectric detection substrate, and improving the productivity of the photoelectric detection substrate. In addition, when a flat layer is being manufactured, it is necessary to perform high-temperature curing, thermal expansion and contraction will occur due to a temperature difference, film peeling, foaming and the like will occur to the photoelectric detection substrate due to a stress generated inside the photoelectric detection substrate. Therefore, the structural stability of the photoelectric detection substrate may be improved by reducing the number of flat layers.

Figure 8:
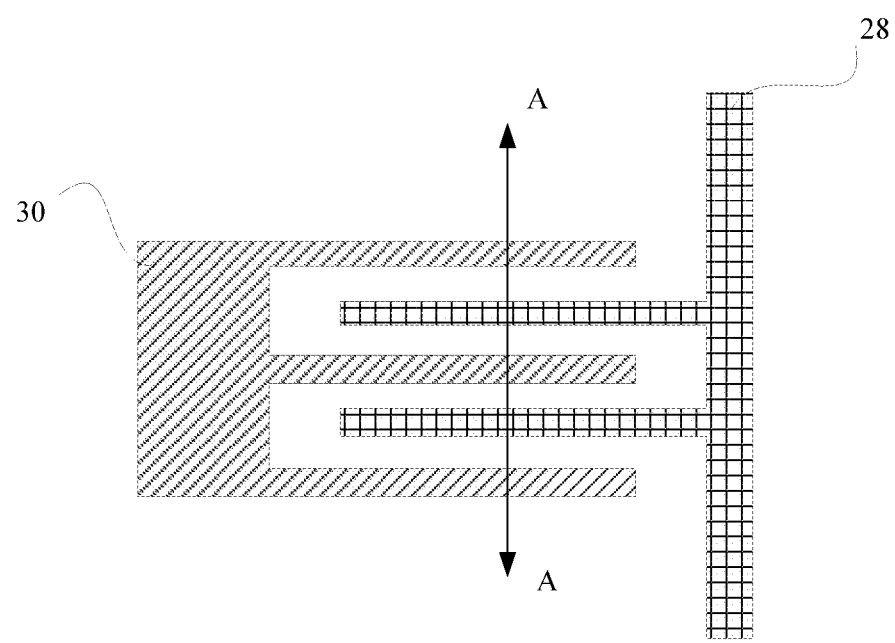
FIG. 8 is a schematic plan diagram of an interdigital electrode according to an embodiment of the present disclosure.

In some embodiments, the interdigital electrode may be made of metal such as Mo, Al, and Cu. As shown in FIG. 8, the interdigital electrode includes comb-shaped sensing sub-electrodes 30 and comb-shaped biasing sub-electrodes 28. The sensing sub-electrodes 30 and the biasing sub-electrodes 28 are arranged alternately and inserted into gaps of each other, wherein FIG. 2 is a schematic cross-sectional view of FIG. 8 in a direction AA.

In the present embodiment, because a PI insulating layer does not need to be formed on the interdigital electrode, the thickness of the interdigital electrode does not need to be designed too small, the thickness of the interdigital electrode may be increased, and the thickness of the interdigital electrode may be 200 nm to 260 nm, so that the climbing performance of the interdigital electrode may be improved, gradient angles at corners of the interdigital electrode may be reduced, poor contact at the corners may be avoided, and signal transmission may be ensured. In addition, the resistance of the interdigital electrode may be reduced, and the thermal noise of the photoelectric detection substrate may be reduced.

In addition, in the present embodiment, the interdigital electrode is manufactured after the semiconductor layer 22 is manufactured, and the thickness of the interdigital electrode is large, so that it may prevent the interdigital electrode from being damaged in a subsequent process. Therefore, there is no need to form a conductive protection pattern on the interdigital electrode, the manufacturing process and structural complexity of the photoelectric detection substrate may be further simplified, and the productivity of the photoelectric detection substrate may be improved.

As shown in FIG. 1, in the photoelectric detection substrate of the related art, the interdigital electrode is located below the semiconductor layer 8. When light is irradiated on the semiconductor layer 8, the density of photocarriers at a side of the semiconductor layer distal to the interdigital electrode 8 is relatively high, and an electric field is generated by the interdigital electrode, so that the utilization of photo-generated carriers is low, which results in lower photocurrent.

In the present embodiment, as shown in FIG. 2, a side surface, distal to the flexible substrate 21, of the semiconductor layer 22 is provided with a plurality of grooves, and the biasing sub-electrodes 28 and the sensing sub-electrodes 30 are located in the grooves. Thus, the semiconductor layer 22 includes portions between the biasing sub-electrodes 28 and the sensing sub-electrodes 30, so that an electric field between the biasing sub-electrodes 28 and the sensing sub-electrodes 30 may be fully utilized to improve the utilization of photo-generated carriers and enhance photocurrent.

As shown in FIG. 2, the photoelectric detection substrate further includes a light shielding metal layer 31, wherein the light shielding metal layer 31 is arranged at the side, distal to the flexible substrate 21, of the semiconductor layer 22. an orthographic projection of the light shielding metal layer 31 on the flexible substrate 21 does not overlap with an orthographic projection of the groove on the flexible substrate 21, namely, a surface between adjacent grooves of the semiconductor layer 22 is provided with the light shielding metal layer 31. Further, an orthographic projection of the active layer 36 of the switching transistor on the flexible substrate 21 falls within the orthographic projection of the light shielding metal layer 31 on the flexible substrate 21. On the one hand, the light shielding metal layer 31 may prevent external light from irradiating on the active layer 36 of the switching transistor and adversely affecting the performance of the switching transistor; on the other hand, the light shielding metal layer 31 may reflect light incident from the outside to form a secondary light path, so that the reflected light re-enters the semiconductor layer 22, resulting in increasing the absorption of light by the semiconductor layer 22 and making the semiconductor layer 22 generate more photo-generated carriers, which is conducive to improvement of the utilization of photo-generated carriers and increase of photocurrents. Therefore, the thickness of the semiconductor layer 22 does not need to be set as being too large. In the related art, the thickness of the semiconductor layer 8 is 450 to 600 nm, and in the present embodiment, the thickness of the semiconductor layer 22 may be 250 to 300 nm. In order to improve the utilization of photo-generated carriers, as shown in FIG. 2, the light shielding metal layer 31 may be not only located at a position corresponding to the active layer 36, but also provided in other areas. In order to ensure the reflection of light, the area of the light shielding metal layer 31 may be as large as possible.

The light shielding metal layer 31 and the interdigital electrode may be made of the same material, so that the light shielding metal layer 31 and the interdigital electrode may be formed simultaneously by a single patterning process, without forming the light shielding metal layer 31 by a special patterning process, which may reduce the number of patterning processes for manufacturing the photoelectric detection substrate.

Figure 3:
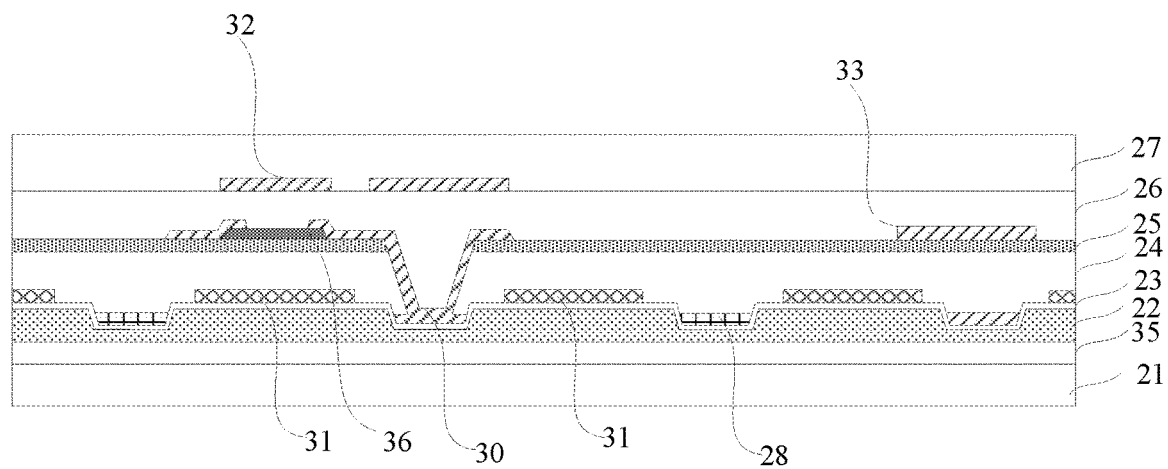

In the present embodiment, the semiconductor layer 22 may be directly formed on the flexible substrate 21, and in order to prevent impurity ions in the flexible substrate 21 from entering the semiconductor layer 22 and adversely affecting the performance of the photoelectric detection substrate, as shown in FIG. 3, the photoelectric detection substrate further includes:

a second insulating layer 35 located between the flexible substrate 21 and the semiconductor layer 22. The second insulating layer 35 may be made of an inorganic insulating material such as silicon nitride, silicon oxide, and silicon oxynitride, the thickness of the second insulating layer 35 does not need to be set as being too large, and may be 100 to 200 nm.

In the present embodiment, the interdigital electrode may be directly formed on the semiconductor layer 22, and in order to reduce the dark current of the photoelectric detection substrate, as shown in FIG. 2, the photoelectric detection substrate further includes: a first insulating layer 23 located between the interdigital electrode and the semiconductor layer 22, wherein the first insulating layer 23 may be made of an inorganic insulating material such as silicon nitride, silicon oxide, and silicon oxynitride. Because the semiconductor layer 22 is directly formed on the flexible substrate 21, the flatness of the side, distal to the flexible substrate 21, of the semiconductor layer 22, namely, the side, proximate to the interdigital electrode, of the semiconductor layer 22, is better. Because there is no need to provide a thick organic insulating layer between the interdigital electrode and the semiconductor layer 22 to ensure the flatness of a side, proximate to the semiconductor layer 22, of the interdigital electrode, the first insulating layer 23 does not need to be made of an organic insulating material, the thickness of the first insulating layer 23 does not need to be set as being too large, may be less than 1 um, and specifically may be 100 to 200 nm, which is conducive to decrease of the thickness of the entire photoelectric detection substrate.

The flat layer 24 is generally made of an organic insulating material such as a resin, and in order to prevent impurities in the flat layer 24 from entering the active layer 36 of the switching transistor and adversely affecting the performance of the switching transistor, a third insulating layer 25 is further provided between the flat layer 24 and the switching thin film transistor. The third insulating layer 25 may be made of an inorganic insulating material such as silicon nitride, silicon oxide, and silicon oxynitride, the thickness of the third insulating layer 25 does not need to be set as being too large, and may be 100 to 200 nm.

Figure 6:
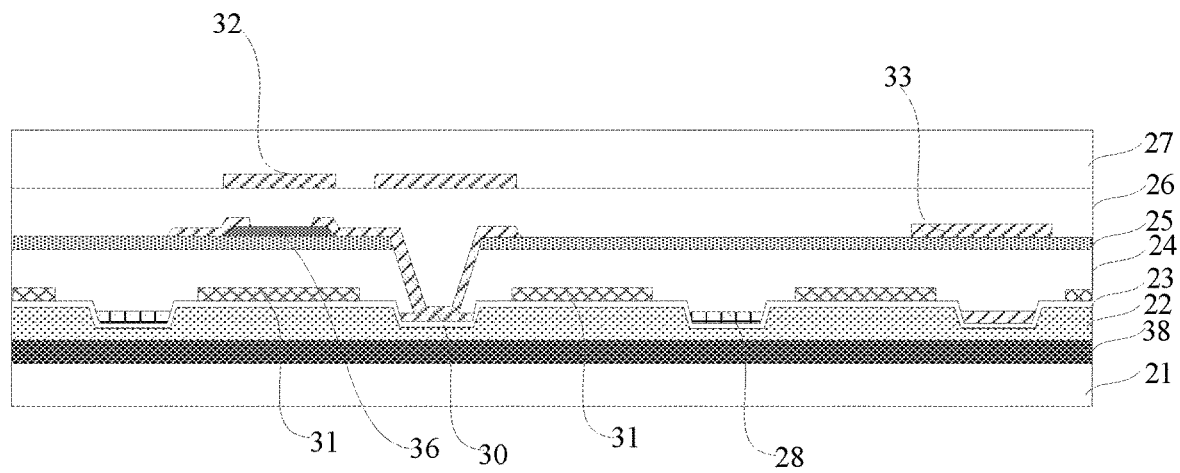

When detection light emitted from a light source is visible light, the semiconductor layer 22 may directly convert an optical signal of the visible light into an electrical signal. When detection light emitted from the light source is invisible light such as an X-ray, in order to enable the semiconductor layer 22 to still realize photoelectric conversion, the photoelectric detection substrate further includes a wavelength conversion layer 38 configured to convert non-visible light into visible light; wherein the wavelength conversion layer 38 is arranged at a side of the semiconductor layer distal to the interdigital electrode 22, as shown in FIG. 6. Thus, external light enters the wavelength conversion layer before entering the semiconductor layer.

In some embodiments of the present disclosure, the above wavelength conversion layer 38 may convert non-visible light (e.g. an X-ray) into visible light having a wavelength of about 550 nm. In this case, the visible light passing through the wavelength conversion layer is re-incident on the semiconductor layer 22 for photoelectric conversion.

In some embodiments of the present disclosure, the above wavelength conversion layer may be made of at least one of phosphor, cesium iodide (CsI), gadolinium oxysulfide phosphor (Gd2O2S: Tb, GOS), tin sulfide (ZnS), cadmium tungstate (CdWO4). It should be noted that the above description is made by taking the non-visible light emitted from the light source being an X-ray as an example. The above light source may further emit other non-visible light, for example, when the non-visible light is a γ-ray, it is only necessary to adjust the material of the wavelength conversion layer so as to convert the γ-ray incident on the wavelength conversion layer into visible light.

Figure 9:
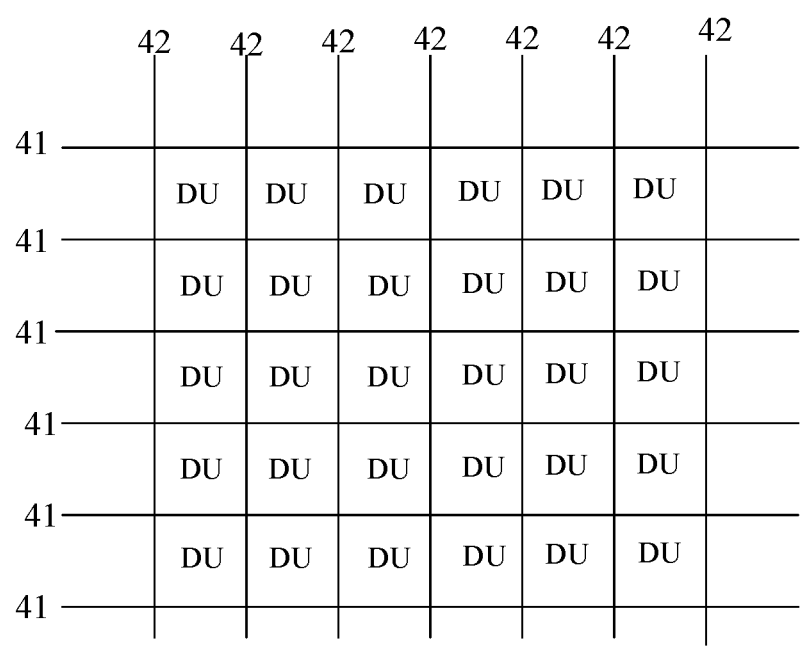
FIG. 9 is a schematic diagram of a plurality of Detection Units (DUs) defined by intersecting reading signal lines with gating signal lines in the photoelectric detection substrate according to an embodiment of the present disclosure.

As shown in FIG. 9, the photoelectric detection substrate of the present embodiment includes a plurality of reading signal lines 42 and a plurality of gating signal lines 41, wherein the reading signal lines 42 and the gating signal lines 41 are intersected to define a plurality of detection units.

It should be noted that in some embodiments of the present disclosure, the reading signal lines 42 and the gating signal lines 41 may be intersected horizontally and vertically, and in this case, the plurality of detection units defined by intersecting the plurality of reading signal lines 42 and the plurality of gating signal lines 41 are arranged in a matrix.

Figure 7:
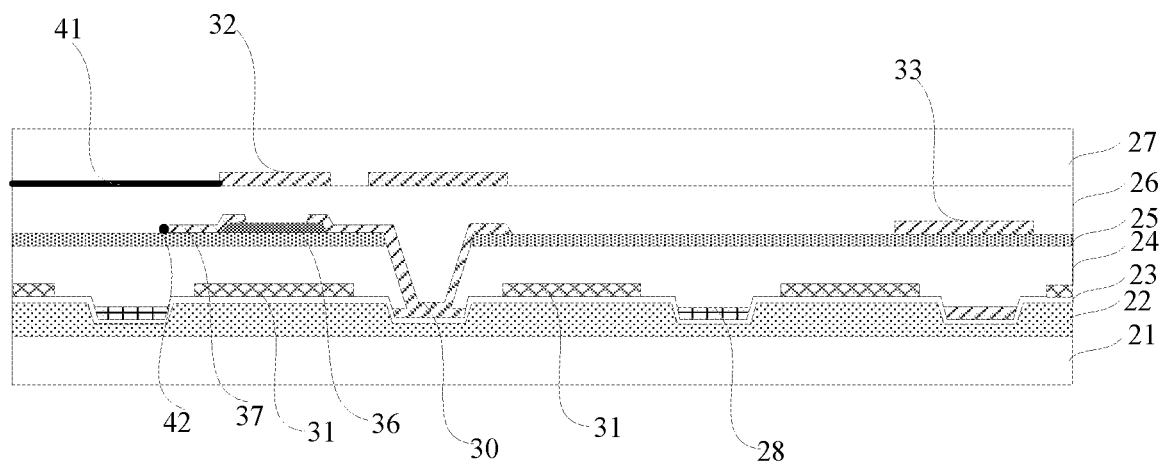

In order to selectively output a detection signal collected by each detection unit, each detection unit is provided therein with one above interdigital electrode and one above switching transistor. A gate electrode of the switching transistor is electrically connected to the gating signal line, a first electrode of the switching transistor is electrically connected to the interdigital electrode, and a second electrode of the switching transistor is electrically connected to the reading signal line. The first electrode of the switching transistor may be a source electrode S, and the second electrode of the switching transistor is a drain electrode D; or, the first electrode of the switching transistor is a drain electrode D, and the second electrode of the switching transistor is a source electrode S. For example, as shown in FIG. 7, the gate electrode 32 of the switching transistor is connected to the gating signal line 41, the source electrode 36 is connected to the sensing sub-electrode 30, and the drain electrode 37 is connected to the reading signal line 42.

It should be noted that the above switching transistor may be an N-type transistor or a P-type transistor, and the present disclosure is not limited thereto.

When the photoelectric detection substrate operates, first, positive voltages V+ having the same voltage value are supplied to the biasing sub-electrodes 28 in all detection units. Then, the gating signal lines 41 are scanned line by line. When one gating signal line 41 receives a scanning signal, a switching transistor connected to the one gating signal line 41 is turned on, and thus, the semiconductor layer 22 transmits the received light-converted electric signal to a sensing sub-electrode 30 located in the same detection unit as the switching transistor which is turned on. Next, a detection signal on the sensing sub-electrode 30 may be transmitted to a reading signal line 42 connected to the switching transistor through the switching transistor which is turned on, thereby completing the reading of the detection signal of detection units in a row.

Based on this, in order to continuously and stably transmit the detection signal on the sensing sub-electrode 30 to the reading signal line 42, the photoelectric detection substrate may further include a storage capacitor electrode 33. In this case, the above storage capacitor electrode 33 and the second electrode such as the drain electrode of the switching transistor may form a storage capacitor, which is configured to store the detection signal on the sensing sub-electrode 30 and continuously and stably transmit the detection signal to the reading signal line 42. The reading of detection signals of the other rows of detection units is the same as above, and will not be described again herein.

Figure 4:
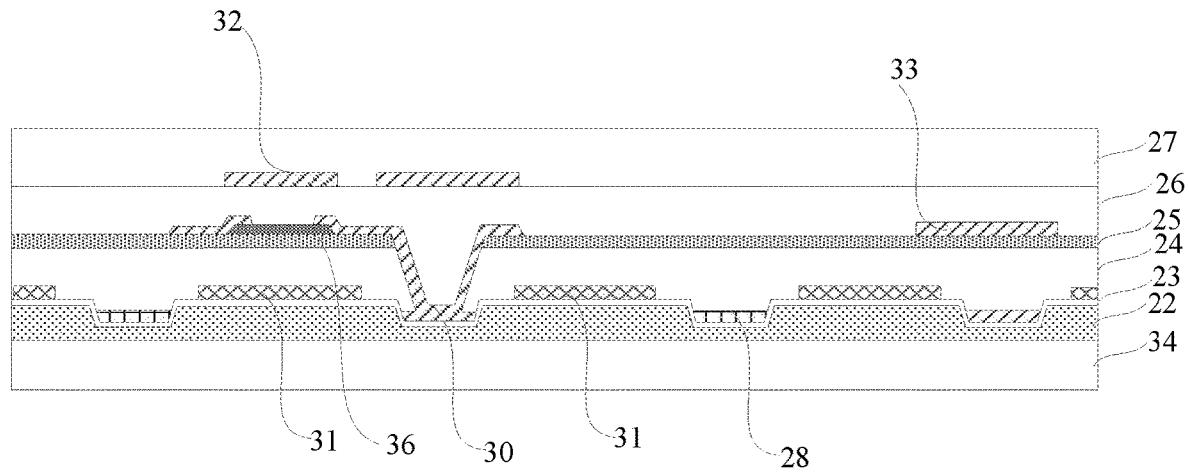
Figure 5:
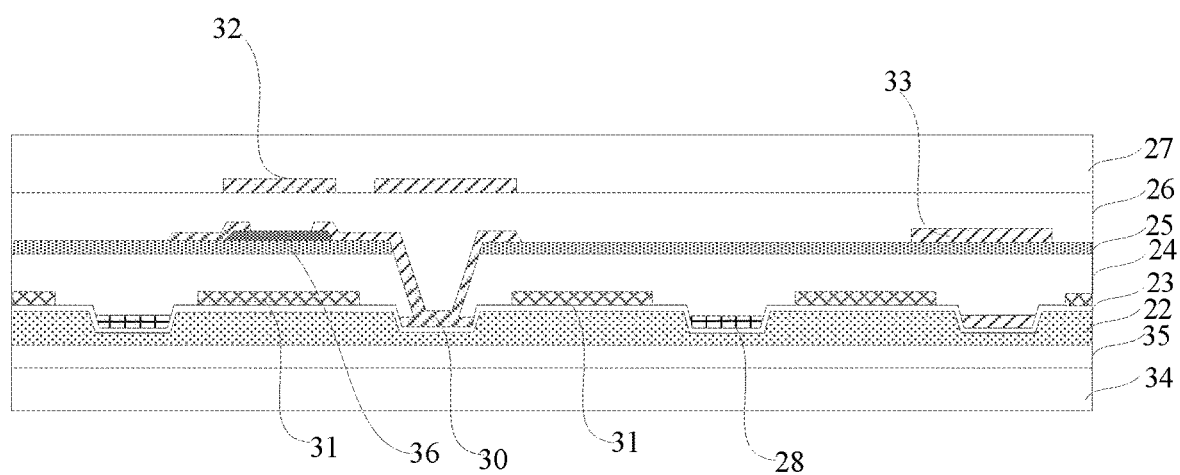

Further, as shown in FIG. 4 and FIG. 5, the base substrate may further be a hard base substrate 34, wherein the hard base substrate 34 may be a quartz substrate, a glass substrate, or the like.

As shown in FIG. 4, when the base substrate is a hard base substrate, the photoelectric detection substrate includes: a hard base substrate 34; a semiconductor layer 22 located on the hard base substrate 34; biasing sub-electrodes 28 and sensing sub-electrodes 30 located on the semiconductor layer 22, wherein the biasing sub-electrodes 28 and the sensing sub-electrodes 30 form an interdigital electrode; a flat layer 24 arranged at a side, distal to the hard base substrate 34, of the interdigital electrode; a switching transistor arranged at a side, distal to the hard base substrate 34, of the flat layer 24, wherein the switching transistor includes a gate electrode formed by a gate metal layer 32, an active layer 36, a source electrode and a drain electrode which are formed by a source-drain metal layer 37, a fourth insulating layer 26, and a passivation layer 27.

In some embodiments, the hard base substrate 34 may be an optical waveguide glass substrate, and thus scattering of incident light may be reduced, utilization of incident light may be improved, thereby improving light detection accuracy.

Wherein the semiconductor layer 22 may be made of a semiconductor amorphous silicon material such as amorphous silicon (a-Si). The fourth insulating layer 26 may be made of at least one inorganic material such as silicon oxide, silicon nitride, and silicon oxynitride.

In some embodiments, as shown in FIG. 8, the interdigital electrode includes comb-shaped sensing sub-electrodes 30 and comb-shaped biasing sub-electrodes 28. The sensing sub-electrodes 30 and the biasing sub-electrodes 28 are alternately arranged and inserted into gaps of each other, wherein FIG. 4 is a schematic cross-sectional view of FIG. 8 in a direction AA.

In the present embodiment, the semiconductor layer 22 is directly formed on the hard base substrate 34, and the hard base substrate 34 itself may provide a flat surface, so that there is no need to form a flat layer before the semiconductor layer 22 is manufactured, the process of manufacturing a flat layer before manufacturing of the semiconductor layer 22 may be omitted, and the number of flat layers in the photoelectric detection substrate may be reduced. As shown in FIG. 4, in the present embodiment, only one flat layer 24 needs to be manufactured, and thus the present embodiment may reduce the number of the processes of manufacturing a flat layer, thereby simplifying the structure of the photoelectric detection substrate, reducing the production cost of the photoelectric detection substrate, and improving the productivity of the photoelectric detection substrate. In addition, when a flat layer is being manufactured, it is necessary to perform high-temperature curing, thermal expansion and contraction will occur due to a temperature difference, and film peeling, foaming and the like will occur to the photoelectric detection substrate due to a stress generated inside the photoelectric detection substrate. Therefore, the structural stability of the photoelectric detection substrate may be improved by reducing the number of flat layers.

In the present embodiment, because a PI insulating layer does not need to be formed on the interdigital electrode, the thickness of the interdigital electrode does not need to be designed as being too small, the thickness of the interdigital electrode may be increased, and the thickness of the interdigital electrode may be 200 to 260 nm, so that the climbing performance of the interdigital electrode may be improved, gradient angles at corners of the interdigital electrode may be reduced, poor contact at the corners may be avoided, and signal transmission may be ensured. In addition, the resistance of the interdigital electrode may be reduced, and the thermal noise of the photoelectric detection substrate may be reduced.

In addition, in the present embodiment, the interdigital electrode is manufactured after the semiconductor layer 22 is manufactured, and the thickness of the interdigital electrode is large, so that it may prevent the interdigital electrode from being damaged in a subsequent process. Therefore, there is no need to form a conductive protection pattern on the interdigital electrode, the manufacturing process and structure complexity of the photoelectric detection substrate may be further simplified, and the productivity of the photoelectric detection substrate may be improved.

As shown in FIG. 1, in the photoelectric detection substrate of the related art, the interdigital electrode is located below the semiconductor layer 8; when light is irradiated on the semiconductor layer 8, the density of photocarriers at the side, distal to the interdigital electrode, of the semiconductor layer 8 is relatively high, and an electric field is generated by the interdigital electrode, so that the utilization of photo-generated carriers is low, which results in low photocurrent.

In the present embodiment, as shown in FIG. 4, a side surface, distal to the hard base substrate 34, of the semiconductor layer 22 is provided with a plurality of grooves, wherein the biasing sub-electrodes 28 and the sensing sub-electrodes 30 are located in the grooves. Thus, the semiconductor layer 22 is located between the biasing sub-electrodes 28 and the sensing sub-electrodes 30, so that an electric field between the biasing sub-electrodes 28 and the sensing sub-electrodes 30 may be fully utilized to improve the utilization of photo-generated carriers and enhance photocurrent.

As shown in FIG. 4, the photoelectric detection substrate further includes a light shielding metal layer 31, wherein the light shielding metal layer 31 is arranged at the side, distal to the hard base substrate 34, of the semiconductor layer 22; and an orthographic projection of the light shielding metal layer 31 on the hard base substrate 34 does not overlap with an orthographic projection of the groove on the hard base substrate 34, namely, a surface between adjacent grooves of the semiconductor layer 22 is provided with the light shielding metal layer 31. Further, an orthographic projection of the active layer 36 of the switching transistor on the hard base substrate 34 falls within the orthographic projection of the light shielding metal layer 31 on the hard base substrate 34. On the one hand, the light shielding metal layer 31 may prevent external light from irradiating on the active layer 36 of the switching transistor and adversely affecting the performance of the switching transistor; on the other hand, the light shielding metal layer 31 may reflect light incident from the outside to form a secondary light path, so that the reflected light re-enters the semiconductor layer 22, increasing the absorption of light by the semiconductor layer 22 and enabling the semiconductor layer 22 to generate more photo-generated carriers, which is conducive to increase of photocurrent. Therefore, the thickness of the semiconductor layer 22 does not need to be set as being too large. In the related art, the thickness of the semiconductor layer 8 is 450 to 600 nm, and in the present embodiment, the thickness of the semiconductor layer 22 may be 250 to 300 nm. In order to improve the utilization of photo-generated carriers, as shown in FIG. 4, the light shielding metal layer 31 is not only located at a position corresponding to the active layer 36, but also provided in other areas, and in order to ensure the reflection of light, the area of the light shielding metal layer 31 may be as large as possible.

The light shielding metal layer 31 and the interdigital electrode may be made of the same material, so that the light shielding metal layer 31 and the interdigital electrode may be formed simultaneously by a single patterning process, while it is not required to form the light shielding metal layer 31 by a special patterning process, which may reduce the number of patterning processes for manufacturing the photoelectric detection substrate.

In the present embodiment, the semiconductor layer 22 may be directly formed on the hard base substrate 34; and in order to prevent impurity ions in the hard base substrate 34 from entering the semiconductor layer 22 and adversely affecting the performance of the photoelectric detection substrate, as shown in FIG. 5, the photoelectric detection substrate further includes:

a second insulating layer 35 located between the hard base substrate 34 and the semiconductor layer 22. The second insulating layer 35 may be made of an inorganic insulating material such as silicon nitride, silicon oxide, and silicon oxynitride, the thickness of the second insulating layer 35 does not need to be set as being too large, and may be 100 to 200 nm.

In the present embodiment, the interdigital electrode may be directly formed on the semiconductor layer 22, and in order to reduce the dark current of the photoelectric detection substrate, as shown in FIG. 4, the photoelectric detection substrate further includes: a first insulating layer 23 located between the interdigital electrode and the semiconductor layer 22, wherein the first insulating layer 23 may be made of an inorganic insulating materials such as silicon nitride, silicon oxide, and silicon oxynitride. Because the semiconductor layer 22 is directly formed on the hard base substrate 34, the flatness of the side, distal to the hard base substrate 34, of the semiconductor layer 22, namely, the side, proximate to the interdigital electrode, of the semiconductor layer 22, is better. Because there is no need to provide a thick organic insulating layer between the interdigital electrode and the semiconductor layer 22 to ensure the flatness of a side, proximate to the semiconductor layer 22, of the interdigital electrode, the first insulating layer 23 does not need to be made of an organic insulating material, the thickness of the first insulating layer 23 does not need to be set as being too large, may be less than 1 um, and specifically may be 100 to 200 nm, which is conducive to decrease of the thickness of the entire photoelectric detection substrate. The flat layer 24 is generally made of an organic insulating material such as a resin, and in order to prevent impurities in the flat layer 24 from entering the active layer 36 of the switching transistor and adversely affecting the performance of the switching transistor, a third insulating layer 25 is further provided between the flat layer 24 and the switching thin film transistor. The third insulating layer 25 may be made of an inorganic insulating material such as silicon nitride, silicon oxide, and silicon oxynitride, the thickness of the third insulating layer 25 does not need to be set as being too large, and may be 100 to 200 nm.

The embodiments of the present disclosure further provide a photoelectric detection device including the above photoelectric detection substrate. Because the above photoelectric detection substrate is flat, the photoelectric detection device may be a flat panel detector. The technical effect of the above photoelectric detection device is the same as that of the photoelectric detection substrate provided in the foregoing embodiments, and will not be described again herein.

The embodiments of the present disclosure further provide a method for manufacturing a photoelectric detection substrate, including the following steps:

a base substrate is provided;

a semiconductor layer is formed on the base substrate;

an interdigital electrode is formed on a side of the semiconductor layer distal to the base substrate;

a flat layer covering the interdigital electrode layer is formed; and a switching transistor is formed at a side of the flat layer distal to the base substrate, wherein the switching transistor is connected to the interdigital electrode through a via hole penetrating through the flat layer.

In the present embodiment, the semiconductor layer is directly formed on the base substrate, and the base substrate itself may provide a flat surface, so that there is no need to form a flat layer before the semiconductor layer is manufactured, the process of manufacturing a flat layer before manufacturing of the semiconductor layer may be omitted, the number of flat layers in the photoelectric detection substrate may be reduced, and the manufacturing process of a flat layer may be reduced, thereby simplifying the structure of the photoelectric detection substrate, reducing the production cost of the photoelectric detection substrate, and improving the productivity of the photoelectric detection substrate. In addition, when a flat layer is being manufactured, it is necessary to perform high-temperature curing, thermal expansion and contraction will occur due to a temperature difference, and film peeling, foaming and the like will occur to the photoelectric detection substrate due to a stress generated inside the photoelectric detection substrate. Therefore, the structural stability of the photoelectric detection substrate may be improved by reducing the number of flat layers.

The base substrate may be a flexible substrate or a hard base substrate.

In the present embodiment, the semiconductor layer may be directly formed on the base substrate. In order to prevent impurity ions in the base substrate from entering the semiconductor layer and adversely affecting the performance of the photoelectric detection substrate, a second insulating layer may be formed on the base substrate before the semiconductor layer is formed, and then the semiconductor layer is formed on the second insulating layer.

In some embodiments, the step that a semiconductor layer is formed on the base substrate includes the following step:

a plurality of grooves are formed on a side surface of the semiconductor layer distal to the base substrate.

The interdigital electrode includes comb-shaped sensing sub-electrodes and comb-shaped biasing sub-electrodes, wherein the sensing sub-electrodes and the biasing sub-electrodes are alternately arranged, and the step that an interdigital electrode is formed includes the following step:

the sensing sub-electrodes and the biasing sub-electrodes are formed in the grooves. Thus, the semiconductor layer includes portions between the biasing sub-electrodes and the sensing sub-electrodes, so that an electric field between the biasing sub-electrodes and the sensing sub-electrodes may be fully utilized to improve the utilization of photo-generated carriers and enhance photocurrent.

In some embodiments, the method for manufacturing the photoelectric detection substrate further includes the following step:

a light shielding metal layer is formed, wherein the light shielding metal layer is located at a side, proximate to the flexible substrate, of an active layer of the switching transistor, an orthographic projection of the light shielding metal layer on the base substrate does not overlap with an orthographic projection of the groove on the base substrate, and an orthographic projection of the active layer on the base substrate falls within the orthographic projection of the light shielding metal layer on the base substrate. On the one hand, the light shielding metal layer may prevent external light from irradiating on the active layer of the switching transistor and adversely affecting the performance of the switching transistor; on the other hand, the light shielding metal layer may reflect light incident from the outside to form a secondary optical path, so that the reflected light re-enters the semiconductor layer, increasing the absorption of light by the semiconductor layer and enabling the semiconductor layer to generate more photo-generated carriers, which is conducive to increase of photocurrent. Therefore, the thickness of the semiconductor layer does not need to be set as being too large, and the thickness of the semiconductor layer may be reduced.

In some embodiments, the light shielding metal layer and the interdigital electrode may be simultaneously formed by a single patterning process, while it is not required to form the light shielding metal layer by a specific patterning process, which may reduce the number of patterning processes for manufacturing the photoelectric detection substrate.

In some embodiments, in order to reduce the dark current of the photoelectric detection substrate, the method for manufacturing the photoelectric detection substrate further includes the following step:

a first insulating layer is formed between the interdigital electrode and the semiconductor layer, wherein the first insulating layer may be made of an inorganic insulating material such as silicon nitride, silicon oxide, and silicon oxynitride.

In some embodiments, in order to prevent impurities in the flat layer from entering the active layer of the switching transistor and adversely affecting the performance of the switching transistor, the method for manufacturing the photoelectric detection substrate further includes the following step:

a third insulating layer is formed between the flat layer and the switching thin film transistor, wherein the third insulating layer may be made of an inorganic insulating material such as silicon nitride, silicon oxide, and silicon oxynitride.

In some embodiments of the present disclosure, before the semiconductor layer is formed, the method for manufacturing the photoelectric detection substrate further includes the following step:

a wavelength conversion layer is formed, wherein the wavelength conversion layer is arranged at a side of the semiconductor layer distal to the interdigital electrode, so that external light enters the wavelength conversion layer before entering the semiconductor layer.

In some embodiments of the present disclosure, the above wavelength conversion layer may convert non-visible light (e.g. an X-ray) to visible light having a wavelength of about 550 nm. In this case, the visible light passing through the wavelength conversion layer is re-incident on the semiconductor layer for photoelectric conversion.

It should be noted that the various embodiments in the present specification are described in a progressive manner, the same or similar parts between the various embodiments may be referred to each other, and each embodiment focuses on the differences from the other embodiments. In particular, the method embodiments are described more simply because they are substantially similar to the product embodiments, to which reference is made.

Unless defined otherwise, technical or scientific terms used in the present disclosure shall have the ordinary meaning as understood by one of ordinary skill in the art to which the present disclosure belongs. As used in the present disclosure, the terms "first", "second" and the like do not denote any order, quantity, or importance, but rather are used to distinguish one element from another. The term "include", "comprise" or the like, means that the element or component preceded by the word is inclusive of the element or component listed after the word and its equivalents, and does not exclude other elements or components. The term "connect", "connected" or the like is not limited to physical or mechanical connection, but may include electrical connection, whether direct or indirect. "Upper", "lower", "left", "right" and the like are used merely to denote relative positional relationships, which may change accordingly when the absolute position of the described object changes.

It may be understood that when an element such as a layer, film, area or substrate is referred to as being "above" or "below" the other element, it may be "above" or "below" the other element "directly" or an intervening element may exist.

In the description of the above embodiments, specific features, structures, materials, or characteristics may be combined in any suitable manner in any one or more embodiments or examples.

The above embodiments are merely specific implementation modes of the present disclosure, but the scope of protection of the present disclosure is not limited thereto, and any modification and substitution apparent to those skilled in the art without departing from the technical scope of the present disclosure shall be covered by the scope of protection of the present disclosure. Accordingly, the scope of protection of the present disclosure is as set forth in the claims.

What is claimed is:

1. A photoelectric detection substrate, comprising:
    a base substrate;
    a semiconductor layer arranged on the base substrate, wherein the semiconductor layer is configured to convert an optical signal into an electrical signal;
    an interdigital electrode arranged at a side of the semiconductor layer distal to the base substrate;
    a flat layer arranged at a side of the interdigital electrode distal to the base substrate; and
    a switching transistor arranged at a side of the flat layer distal to the base substrate, wherein the switching transistor is connected to the interdigital electrode through a via hole penetrating through the flat layer;
    wherein the interdigital electrode comprises comb-shaped sensing sub-electrodes and comb-shaped biasing sub-electrodes, and the sensing sub-electrodes and the biasing sub-electrodes are arranged alternately;
    wherein a side surface of the semiconductor layer distal to the base substrate is provided with a plurality of grooves in which the sensing sub-electrodes and the biasing sub-electrodes are arranged.

2. The photoelectric detection substrate according to claim 1, wherein a light shielding metal layer is arranged on the side surface of the semiconductor layer distal to the base substrate, and an orthographic projection of the light shielding metal layer on the base substrate does not overlap with an orthographic projection of the plurality groove on the base substrate.

3. The photoelectric detection substrate according to claim 2, wherein the light shielding metal layer and the interdigital electrode are made of a same material.

4. The photoelectric detection substrate according to claim 2, further comprising: a plurality of reading signal lines and a plurality of gating signal lines, wherein the reading signal lines and the gating signal lines are intersected to define a plurality of detection units;
    a respective one of the sensing sub-electrodes and a respective one of the switching transistors are arranged in each of the detection units; and
    a gate electrode of the switching transistor is electrically connected to the plurality of gating signal lines, a first electrode of the switching transistor is electrically connected to the sensing sub-electrodes, and a second electrode of the switching transistor is electrically connected to the plurality of reading signal lines.

5. The photoelectric detection substrate according to claim 4, wherein an orthographic projection of an active layer of the switching transistor on the base substrate is within the orthographic projection of the light shielding metal layer on the base substrate.

6. The photoelectric detection substrate according to claim 1, further comprising:
    a first insulating layer arranged between the interdigital electrode and the semiconductor layer;
    a second insulating layer arranged between the base substrate and the semiconductor layer.

7. The photoelectric detection substrate according to claim 1, wherein the interdigital electrode is in direct physical contact with the semiconductor layer.

8. The photoelectric detection substrate according to claim 1, wherein the interdigital electrode has a thickness of 200 nm to 260 nm;
    the semiconductor layer has a thickness of 250 nm to 300 nm;
    the base substrate is an optical waveguide glass substrate or a flexible substrate.

9. The photoelectric detection substrate according to claim 1, further comprising: a wavelength conversion layer configured to convert non-visible light into visible light;
    wherein the wavelength conversion layer is arranged at a side of the semiconductor layer distal to the interdigital electrode.

10. A photoelectric detection device comprising the photoelectric detection substrate according to claim 1.

11. A method for manufacturing a photoelectric detection substrate, comprising:
    providing a base substrate;
    forming a semiconductor layer on the base substrate, wherein the semiconductor layer is configured to convert an optical signal into an electrical signal;

forming an interdigital electrode at a side of the semiconductor layer distal to the base substrate;

forming a flat layer covering the interdigital electrode; and forming a switching transistor at a side of the flat layer distal to the base substrate, wherein the switching transistor is connected to the interdigital electrode through a via hole penetrating through the flat layer;

wherein the interdigital electrode comprises comb-shaped sensing sub-electrodes and comb-shaped biasing sub-electrodes, the sensing sub-electrodes and the biasing sub-electrodes are arranged alternately, forming the semiconductor layer on the base substrate comprises: forming a plurality of grooves on a side surface of the semiconductor layer distal to the base substrate, forming the interdigital electrode at the side of the semiconductor layer distal to the base substrate comprises: forming the sensing sub-electrodes and the biasing sub-electrodes in the plurality of grooves.

12. The method according to claim 11, further comprising:

forming a light shielding metal layer, wherein the light shielding metal layer is arranged at a side of an active layer of the switching transistor proximate to the base substrate, an orthographic projection of the light shielding metal layer on the base substrate does not overlap with an orthographic projection of the plurality of grooves on the base substrate; and an orthographic projection of the active layer on the base substrate is within the orthographic projection of the light shielding metal layer on the base substrate.

13. The method according to claim 12, wherein the light shielding metal layer and the interdigital electrode are formed by a single patterning process.

14. The method according to claim 11, further comprising:

forming a first insulating layer located between the interdigital electrode and the semiconductor layer;

forming a third insulating layer located between the flat layer and the switching transistor.

15. The method according to claim 11, further comprising:

before forming the semiconductor layer, forming a wavelength conversion layer at a side of the semiconductor layer distal to the interdigital electrode, wherein the wavelength conversion layer is configured to convert non-visible light into visible light.

* * * * *